United States Patent [19]

Geenen et al.

[11] Patent Number: 4,758,874
[45] Date of Patent: Jul. 19, 1988

[54] DIODE AND METAL STUD THEREFOR

[75] Inventors: Hendrikus H. Geenen; Gerardus E. H. Snijders, both of Maarheeze, Netherlands

[73] Assignee: U.S. Philips Corp., New York, N.Y.

[21] Appl. No.: 839,249

[22] Filed: Mar. 13, 1986

[30] Foreign Application Priority Data

Nov. 5, 1985 [NL] Netherlands ............... 8503023

[51] Int. Cl.[4] .................. H01L 29/46; H01L 23/54; H01L 21/447
[52] U.S. Cl. ........................ 357/68; 357/73; 357/67; 357/65
[58] Field of Search ............. 357/67, 73, 74, 79, 357/65; 75/252

[56] References Cited

U.S. PATENT DOCUMENTS

| | | | |
|---|---|---|---|
| 3,698,055 | 10/1972 | Holtz, Jr. et al. | 75/252 |
| 3,927,815 | 12/1975 | Mase et al. | 357/74 |
| 3,996,602 | 12/1976 | Goldberg | 357/73 |
| 4,485,150 | 11/1984 | Tsuno | 75/252 |

Primary Examiner—Andrew J. James
Assistant Examiner—Sheila V. Clark
Attorney, Agent, or Firm—Norman N. Spain

[57] ABSTRACT

A diode according to the invention comprises an electrically insulating envelope (2), within which a wafer (1) of semiconductor material with a pn junction is enclosed between metal studs (3,4). The metal studs (3,4) are sinter bodies mainly comprising tungsten, a sintering activator and a material chosen from the group comprising $Y_2O_3$, $SiO_2$, $Al_2O_3$, $ZrO_2$ and $ThO_2$. The metal studs (3,4) can be manufactured at a comparatively low temperature and nevertheless have a very high density and a very great strength as well as a fine structure.

7 Claims, 1 Drawing Sheet

DIODE AND METAL STUD THEREFOR

BACKGROUND OF THE INVENTION

The invention relates to a diode comprising an electrically insulating envelope, within which a semiconductor wafer with a pn junction is enclosed between metal studs, and current conductors which are connected to a respective metal stud and project beyond the envelope, the metal studs being sintered bodies mainly comprising tungsten and a metal promoting the sintering process; the invention further relates to a metal stud suitable for use in such a diode. Such a diode is known from Japanese Patent Application 58-75862 A (Touchou Kinzoku K.K. 1983-5-7).

Before sintering, less than 0.5% by weight of Ni has been added to the tungsten of the studs of the known diode. The addition renders it possible to sinter the studs at a lower temperature (1800°–1950° C.) than is the case in the absence of Ni. Without the addition of Ni, the sintering process has be effected at a temperature at least 2200° C. in order to be able to accomplish the operation within a reasonable period of about half an hour.

However a disadvantage of the use of Ni as sintering activator is that it leads to a considerably coarser structure of the sintered body, as is apparent from photographs in the aforementioned Japanese Patent Application. It has been found that, when the structure becomes coarser, this leads to a reduction of the mechanical strength of the metal studs.

BRIEF SUMMARY OF THE INVENTION

The invention has for its object to provide (diodes with) sintered metal studs consisting mainly of tungsten, which can be readily manufactured and have a great strength.

According to the invention, this object can be achieved in a diode of the kind described in the opening paragraph and in metal studs suitable for this diode in that the metal studs also contain an oxide chosen from the group comprising $Y_2O_3$, $SiO_2$, $Al_2O_3$, $ZrO_2$ and $ThO_2$.

It has been found that the additive of a small quantity of this oxide to the studs leads to a great strength and at the same time to a fine structure of the studs. This is also the case if the metal promoting the sintering process is present in a quantity which—according to the aforementioned Japanese Patent Application—is no longer permissible, such as 0.5% by weight or more.

It is known from Japanese Patent Application 55-123135 A (Tokyo Shibaura Denki K.K., 1980-9-22) that tungsten sintered bodies can contain instead of Ni, as a metal promoting the sintering process, Fe or Co. Furthermore, it has been found that palladium is a suitable alternative.

A favorable consequence of the presence of the indicated oxide is that the sintering activator (the metal promoting the sintering process) may be present in a comparatively large quantity, for example, in a quantity of 0.2–2% by weight, more particularly from 0.3 to 0.8% by weight. In fact it has been found that a high density of the sintered studs and a great strength can be attained even at a considerably lower temperature within a short period. A sintering temperature of about 1500° C., for example 1425°–1600° C., for 30 minutes yields a density of 95% or more of the largest possible density (95% = 18.3 g/cm$^3$).

The addition of the indicated oxide substantially does not influence the electrical properties of the studs because a small quantity is sufficient. In general a quantity of not more than 2% by weight is amply sufficient. As a rule, a quantity of from 0.2 to 1% by weight, more particularly from 0.4 to 0.7% by weight, is sufficient.

DETAILED DESCRIPTION OF THE INVENTION

Figure 1:
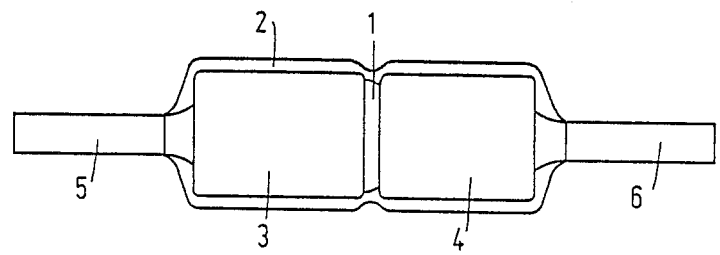
FIG. 1 is a side elevation of a diode of the invention.

The invention will now be described in greater detail with reference to the figures of the drawing.

As shown in FIG. 1, a wafer 1 of simiconductor material with a pn junction is enclosed within a glass envelope 2 between metal studs 3, 4 which are connected to to a respective current conductor 5,6 projecting beyond the envelope. In the embodiment of the diode shown, the glass envelope 2 keeps the studs 3,4 pressed on both sides against the wafer 1.

Figure 2:
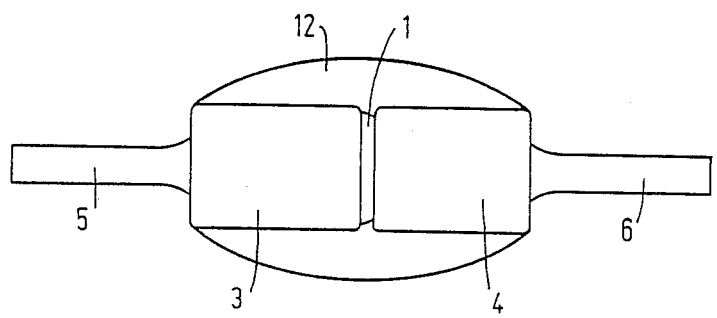
FIG. 2 is a side elevation of an additional diode of the invention.

In the diode shown in FIG. 2 the parts corresponding to those in FIG. 1 are designated by the same reference numerals. The diode shown in this Figure is a drop diode, in which the glass envelope 12 is in the form of a drop. The studs 3,4 are connected in this embodiment by means of solder to the wafer 1.

In both figures the metal studs 3 and 4 are sintered bodies mainly comprising tungsten and a metal promoting the sintering process and they also contain an oxide chosen from the group consisting of $Y_2O_3$, $Al_2O_3$, $SiO_2$, $ZrO_2$ and $ThO_2$.

The metal studs were obtained as follows:

Tungsten powder was incorporated in a solution of $Ni(NO_3)_2$ in demineralized water. The mixture was shaken for 2 hours and was then dried in vacuo at 100° C. Subsequently, the powder was incorporated in a $Y(NO_3)_3$ solution in water, shaken for 2 hours and then dried in vacuo. The dried powder was heated in hydrogen at 850° C. in order to convert the salts into Ni and $Y_2O_3$, respectively. The content of Ni, like that of $Y_2O_3$, was 0.5% by weight.

The powder obtained was mixed with a dry binder, was then incorporated in demineralized water and granulated. The granulate was sieved in order to isolate the fraction of 44–144 μm.

The granulate was molded by pressing pressed to moldings, after which the moldings were decarbonized in hydrogen/water vapour at 1000° C.

The moldings were then sintered to form studs by increasing the temperature from 1000° by 25° C. per minute to the final temperature and keeping the moldings at this temperature for some time.

For comparison, tungsten studs were made in a similar manner, (which contained only 0.5% by weight of Ni).

The density of both types of studs (i.e. containing and not containing $Y_2O_3$), was determined. This density is indicated, expressed in % of the largest possible density, in Table 1. The strength was also determined of those sinter bodies whose density was at least 95.0%. Table 1 indicates the pressure required for deforming the sinter bodies by 1%.

TABLE 1

| sintered at final temperature - for (min.) | | 1425° C. | | 1500° C. | | 1700° C. | |
|---|---|---|---|---|---|---|---|
| | | (%) | N/mm² | (%) | N/mm² | (%) | N/mm² |
| 0 | 0% $Y_2O_3$ | 87.2 | | 93.9 | | 95.7 | 741 |
| 0 | 0.5% $Y_2O_3$ | 92.9 | | 96.3 | 1264 | 97.5 | 1019 |
| 15 | 0% $Y_2O_3$ | 92.2 | | 96.3 | 797 | 96.1 | 699 |
| 15 | 0.5% $Y_2O_3$ | 95.2 | 1262 | 97.3 | 1162 | 97.4 | 999 |
| 30 | 0% $Y_2O_3$ | 93.9 | | 96.8 | 774 | 96.3 | 705 |
| 30 | 0.5% $Y_2O_3$ | 95.0 | 1265 | 97.4 | 1169 | 97.7 | 938 |
| 60 | 0% $Y_2O_3$ | 94.6 | | 96.6 | 775 | | |
| 60 | 0.5% $Y_2O_3$ | 95.7 | 1177 | | | | |

It appears from the Table that the studs containing $Y_2O_3$ always have a higher density than studs manufactured in a similar manner, but not containing $Y_2O_3$. It has also always been found that the structure of the studs containing $Y_2O_3$ is considerably finer than that of studs not containing $Y_2O_3$.

It further appears from the table that the studs containing $Y_2O_3$ have a considerably greater strength than studs manufactured in a similar manner, but not containing $Y_2O_3$.

It is further apparent from the table 1 that the studs according to the invention that are sintered at a low temperature in the range from 1425° C. to 1500° C., have essentially improved roughness. The roughness of the studs according to the invention is always smaller than the maximum permissible roughness of 5 μm.

What is claimed is:

1. A diode comprising an electrically insulating envelope, within which envelope a wafer of semiconductor material with a pn junction is enclosed between metal studs, and current conductors each of which is connected to a respective metal stud and project beyond the envelope, the metal studs being sintered bodies mainly comprising tungsten and a metal promoting the sintering process, characterized in that the metal studs further contain an oxide chosen from the group consisting of $Y_2O_3$, $SiO_2$, $Al_2O_3$, $ZrO_2$ and $ThO_2$.

2. The diode of claim 1 wherein the metal promoting the sintering process is present in an amount of 0.2–2 percent by weight and the oxide is present in an amount of from 0.2 to 1.0 percent by weight.

3. The diode of claim 1 wherein the metal promoting the sintering process is present in an amount of from 0.3–0.8 percent by weight and the oxide is present in an amount of from 0.4–0.7 percent by weight.

4. The diode of claim 1 wherein the metal promoting the sintering process is nickel.

5. The diode of claim 2 wherein the metal promoting the sintering process is nickel.

6. The diode of claim 1 wherein the metal stud is sintered at a temperature of from 1425° C. to 1500° C.

7. The diode of claim 4 wherein the metal stud is sintered at a temperature of from 1425° C. to 1500° C.

* * * * *